(12) United States Patent
Shimizu et al.

(10) Patent No.: US 8,502,270 B2
(45) Date of Patent: Aug. 6, 2013

(54) COMPOUND SEMICONDUCTOR DEVICE AND METHOD FOR MANUFACTURING THE SAME

(75) Inventors: Sanae Shimizu, Kawasaki (JP); Atsushi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 13/352,645

(22) Filed: Jan. 18, 2012

(65) Prior Publication Data
US 2012/0205718 A1 Aug. 16, 2012

(30) Foreign Application Priority Data
Feb. 14, 2011 (JP) ................................ 2011-029093

(51) Int. Cl.
*H01L 29/66* (2006.01)
(52) U.S. Cl.
USPC ...... 257/187; 257/192; 257/194; 257/E29.246
(58) Field of Classification Search
USPC ............................ 257/187, 192, 194, E29.246
See application file for complete search history.

(56) References Cited

U.S. PATENT DOCUMENTS

| 2004/0209402 A1* | 10/2004 | Chai et al. ...................... 438/122 |
| 2012/0058626 A1* | 3/2012 | Sugiyama et al. ............. 438/478 |
| 2012/0205783 A1* | 8/2012 | Lee et al. ...................... 257/618 |

FOREIGN PATENT DOCUMENTS

| JP | 11-214798 | | 8/1999 |
| JP | 2002-124473 | A1 | 4/2002 |
| JP | 2005-235989 | A1 | 9/2005 |
| JP | 2010-161359 | A1 | 7/2010 |

* cited by examiner

*Primary Examiner* — Ngan Ngo
(74) *Attorney, Agent, or Firm* — Kratz, Quintos & Hanson, LLP

(57) ABSTRACT

A compound semiconductor device including: a substrate; an electron transit layer formed on and above the substrate; and an electron supply layer formed on and above the electron transit layer, wherein a first region or regions having a smaller thermal expansion coefficient than the electron transit layer and a second region or regions having a larger thermal expansion coefficient than the electron transit layer are mixedly present on a surface of the substrate.

16 Claims, 13 Drawing Sheets

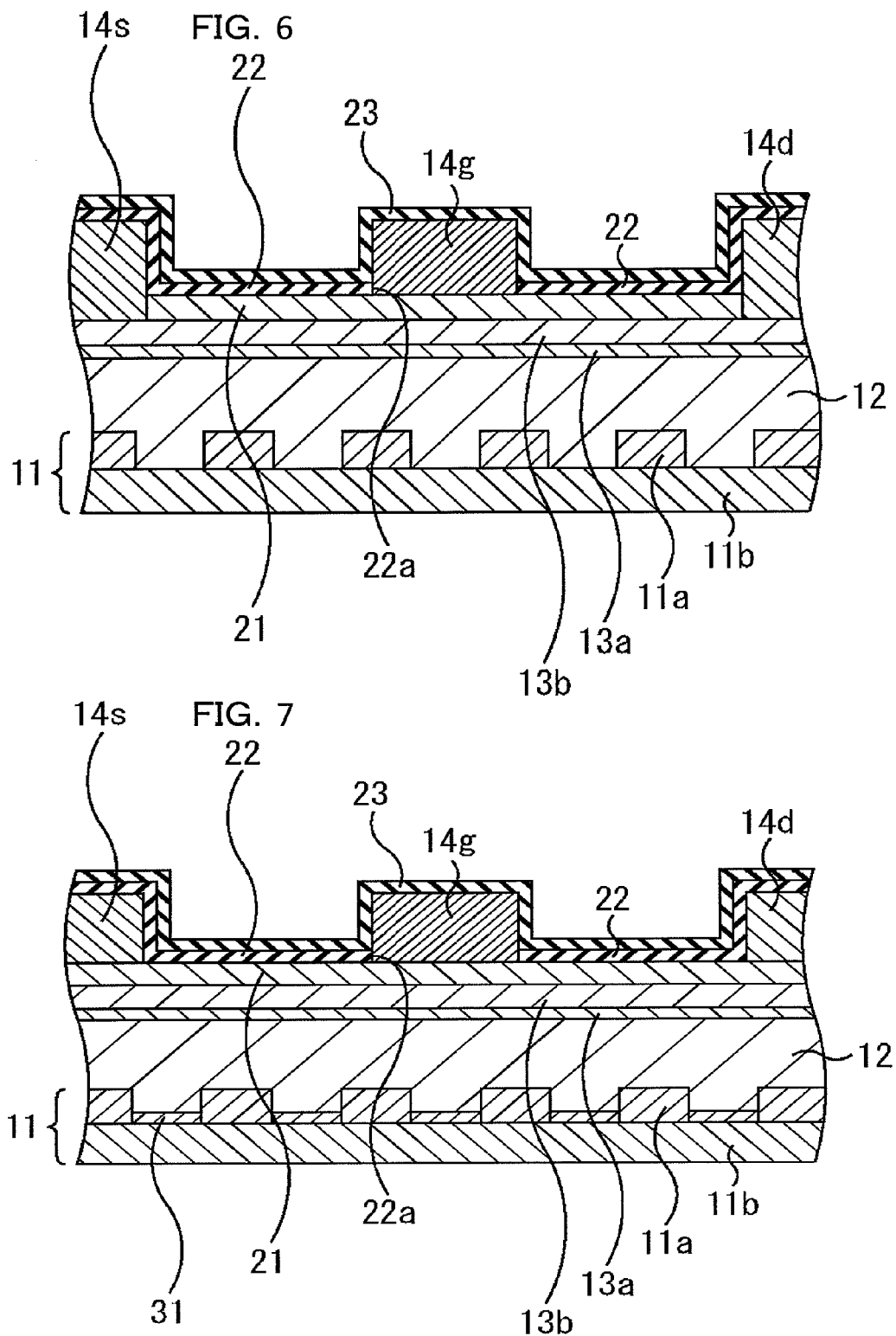

COMPOUND SEMICONDUCTOR DEVICE AND METHOD FOR MANUFACTURING THE SAME

CROSS REFERENCE TO RELATED APPLICATION

This application is based upon and claims the benefit of priority from the prior Japanese Patent Application NO. 2011-029093 filed on Feb. 14, 2011, the entire contents of which are incorporated herein by reference.

FIELD

The embodiments disclosed hereafter is related to a compound semiconductor device and a method for manufacturing the compound semiconductor device.

BACKGROUND

In recent years, active efforts have been made to develop an electronic device (compound semiconductor device) provided with a GaN layer and an AlGaN layer formed on and above a substrate in this order to use the GaN layer as electron transit layer. One example of such a compound semiconductor device is a GaN-based high electron mobility transistor (HEMT). Using the GaN-based HEMT as a switch of a power supply inverter may achieve both the reduction of on-resistance and the improvement of withstand voltage. The HEMT is also capable of reducing standby power consumption and increasing operating frequencies, as compared with an Si-based transistor. Switching losses and the power consumption of an inverter may therefore be possible. In addition, as far as transistors of like performance are concerned, the GaN-based HEMT may be made smaller in size than a Si-based transistor.

In the GaN-based HEMT whose GaN layer is used as an electron transit layer and whose AlGaN layer is used as an electron supply layer, strain arises in AlGaN due to a difference in lattice constant between AlGaN and GaN. This causes piezoelectric polarization and a high-concentration two-dimensional electron gas (2DEG) is generated. Accordingly, this GaN-based HEMT is applied to a high-power device.

It is difficult, however, to manufacture a GaN substrate excellent in crystallinity. For this reason, a GaN layer, an AlGaN layer and other layers are conventionally formed on and above an Si substrate, a sapphire substrate or an SiC substrate by heteroepitaxy in most cases. The Si substrate, in particular, is easy to obtain at low cost as a large-diameter high-quality substrate. Accordingly, a structure with GaN and AlGaN layers grown on and above a Si substrate has been actively studied.

However, the GaN layer, the AlGaN layer and the Si substrate have significantly different thermal expansion coefficients. In addition, high-temperature treatment is requested for the epitaxy of the GaN and AlGaN layers. Accordingly, warpage, cracks or the like may occur in the Si substrate due to the different thermal expansion coefficients at the time of such a high-temperature treatment. In view of such a problem associated with the different thermal expansion coefficients, there has been proposed a composite substrate in which Si is crystal-grown on a sapphire substrate.

It is difficult, however, to grow an excellent Si crystal on a sapphire substrate. In addition, sapphire and Si have a larger difference in thermal expansion coefficient than that between a nitride semiconductor and Si. Thus, warpage, cracks or the like is more likely to occur in the composite substrate. This is also true for a composite substrate in which an Si substrate is bonded to a sapphire substrate.

[Document 1] Japanese Laid-open Patent Publication No. 2005-235989
[Document 2] Japanese Laid-open Patent Publication No. 11-214798
[Document 3] Japanese Patent No. 4126863
[Document 4] Japanese Laid-open Patent Publication No. 2010-161359

SUMMARY

According to One aspect of the embodiments, there is provided a compound semiconductor device includes: a substrate; an electron transit layer formed on and above the substrate; and an electron supply layer formed on and above the electron transit layer. A first region or regions having a smaller thermal expansion coefficient than the electron transit layer and a second region or regions having a larger thermal expansion coefficient than the electron transit layer are mixedly present on a surface of the substrate.

According to another aspect of the embodiments, there is a method for manufacturing a compound semiconductor device includes: forming an electron transit layer on and above a substrate; and forming an electron supply layer on and above the electron transit layer. A first region or regions having a smaller thermal expansion coefficient than the electron transit layer and a second region or regions having a larger thermal expansion coefficient than the electron transit layer are mixedly present on a surface of the substrate.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF THE DRAWINGS

FIG. 6 is a cross-sectional view illustrating a modified example of the second embodiment;

FIG. 7 is a schematic view illustrating a structure of a GaN-based HEMT according to a third embodiment;

DESCRIPTION OF THE PREFERRED EMBODIMENTS

Hereinafter, embodiments will be described specifically while referring to the accompanying drawings.

First Embodiment

First, a first embodiment will be described. FIGS. 1A, 1B, 1C, 1D are schematic views illustrating a structure of a GaN-based HEMT (compound semiconductor device) according to the first embodiment.

Figure 1A:
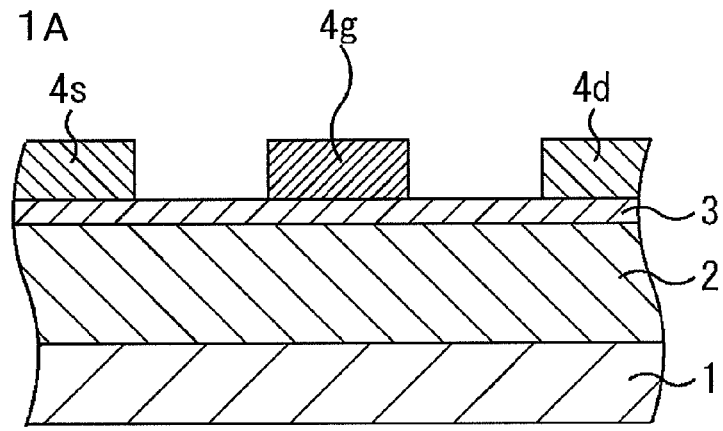
FIGS. 1A, 1B, 1C, 1D are schematic views illustrating a structure of a GaN-based HEMT according to a first embodiment.

In the first embodiment, as illustrated in FIG. 1A, an electron transit layer 2 is formed on a substrate 1 and an electron supply layer 3 is formed on the electron transit layer 2. In addition, a gate electrode 4g, a source electrode 4s and a drain electrode 4d are formed on the electron supply layer 3, so that the source electrode 4s and the drain electrode 4d sandwich the gate electrode 4g therebetween.

Figure 1B:
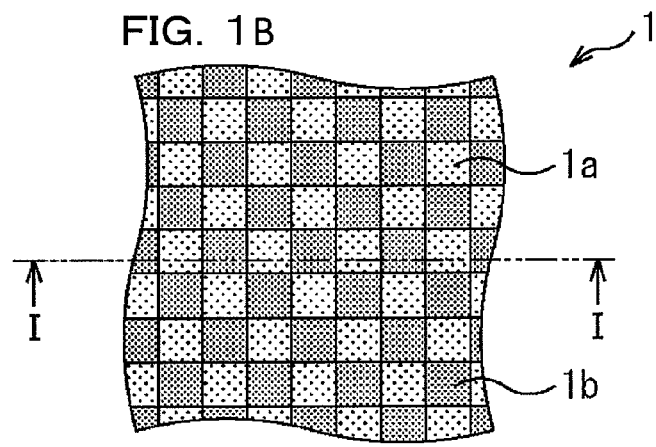

In the present embodiment, as illustrated in FIG. 1B, large-thermal expansion coefficient regions 1a containing a substance having a larger thermal expansion coefficient than a substance composing the electron transit layer 2 and small-thermal expansion coefficient regions 1b containing a substance having a smaller thermal expansion coefficient than the substance composing the electron transit layer 2 are mixedly present on a surface of the substrate 1.

In the present embodiment configured as described above, a tensile stress acts upon the electron transit layer 2 on the upside of a bonding face between each large-thermal expansion coefficient region 1a and the electron transit layer 2, and a compressive stress acts upon the electron transit layer 2 on the upside of a bonding face between each small-thermal expansion coefficient region 1b and the electron transit layer 2, when the electron transit layer 2 is formed by high-temperature epitaxy. Consequently, these stresses cancel each other out. Likewise, a compressive stress acts upon the substrate 1 on the downside of the bonding face between each large-thermal expansion coefficient region 1a and the electron transit layer 2 and a tensile stress acts upon the substrate 1 on the downside of the bonding face between each small-thermal expansion coefficient region 1b and the electron transit layer 2. Consequently, these stresses also cancel each other out. Accordingly, even if the electron transit layer 2 is formed by high-temperature epitaxy, warpage, cracks and the like are unlikely to occur in the substrate 1 at that time.

Figure 1C:
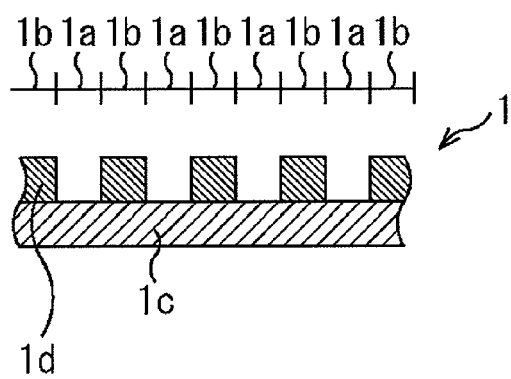
Figure 1D:
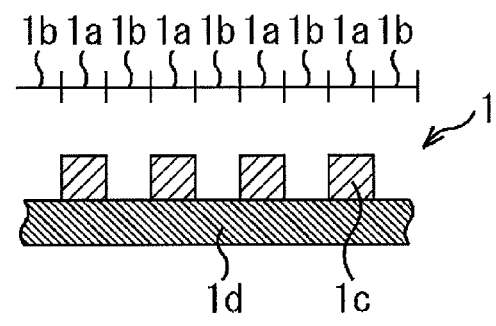

Note that the configuration of the large-thermal expansion coefficient regions 1a and the small-thermal expansion coefficient regions 1b is not limited thereto. For example, as illustrated in FIG. 1C, openings, which expose a large-thermal expansion coefficient substrate material 1c having a larger thermal expansion coefficient than the electron transit layer 2, may be formed on a surface of the large-thermal expansion coefficient substrate material 1c, and a small-thermal expansion coefficient substrate material 1d having a smaller thermal expansion coefficient than the electron transit layer 2 may be bonded to the large-thermal expansion coefficient substrate material 1c. Alternatively, as illustrated in FIG. 1D, the large-thermal expansion coefficient substrate material 1c in which openings, which expose the small-thermal expansion coefficient substrate material 1d, are formed may be bonded to a surface of the small-thermal expansion coefficient substrate material 1d. FIGS. 1C and 1D illustrate cross sections viewed along a line I-I in FIG. 1B.

Figure 2A:
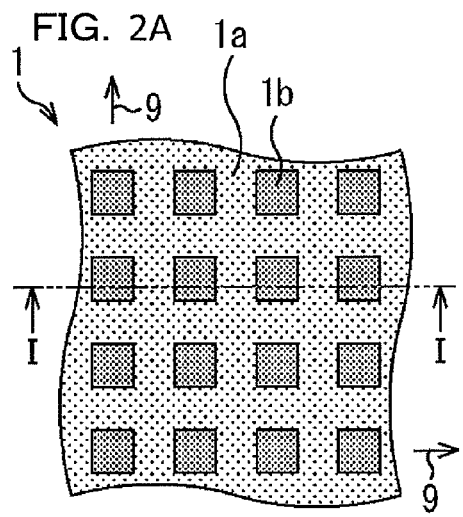
FIGS. 2A, 2B, 2C, 2D, 2E, 2F are schematic views illustrating examples of arrays of large-thermal expansion coefficient regions and small-thermal expansion coefficient regions.
Figure 2B:
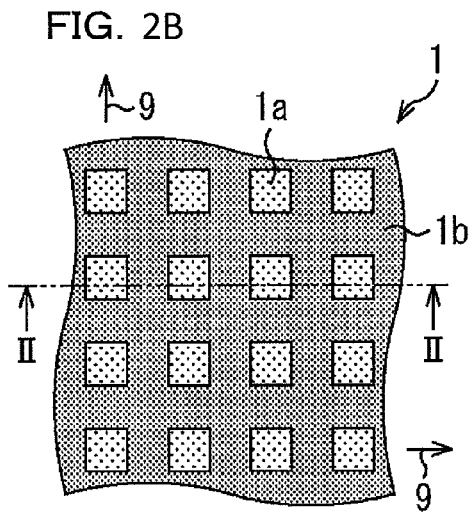
Figure 2C:
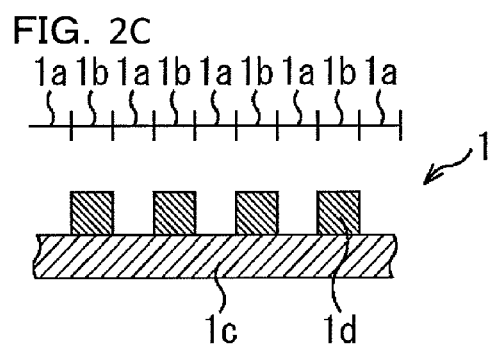
Figure 2D:
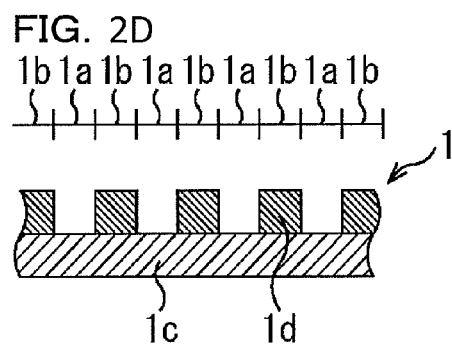
Figure 2E:
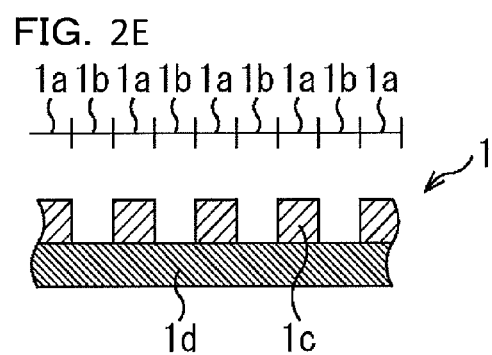
Figure 2F:
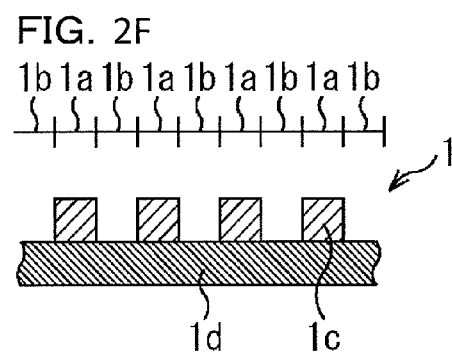

Although in the example illustrated in FIG. 1B, the large-thermal expansion coefficient regions 1a and the small-thermal expansion coefficient regions 1b are arranged in a checkered pattern, the array of these regions is not limited thereto. For example, as illustrated in FIG. 2A, small-thermal expansion coefficient regions 1b square in planar shape may be arranged in a dotted pattern, and a large-thermal expansion coefficient region 1a may surround each small-thermal expansion coefficient region 1b. Also in this case, as illustrated in FIG. 2C, the small-thermal expansion coefficient substrate material 1d may be bonded to a surface of the large-thermal expansion coefficient substrate material 1c, or as illustrated in FIG. 2E, the large-thermal expansion coefficient substrate material 1c may be bonded to a surface of the small-thermal expansion coefficient substrate material 1d. FIGS. 2C and 2E illustrate cross sections viewed along a line I-I in FIG. 2A. In addition, as illustrated in FIG. 2B, large-thermal expansion coefficient regions 1a square in planar shape may be arranged in a dotted pattern, and a small-thermal expansion coefficient region 1b may surround each large-thermal expansion coefficient region 1a. Also in this case, as illustrated in FIG. 2D, the small-thermal expansion coefficient substrate material 1d may be bonded to a surface of the large-thermal expansion coefficient substrate material 1c, or as illustrated in FIG. 2F, the large-thermal expansion coefficient substrate material 1c may be bonded to a surface of the small-thermal expansion coefficient substrate material 1d. FIGS. 2D and 2F illustrate cross sections viewed along a line II-II in FIG. 2B.

Figure 3A:
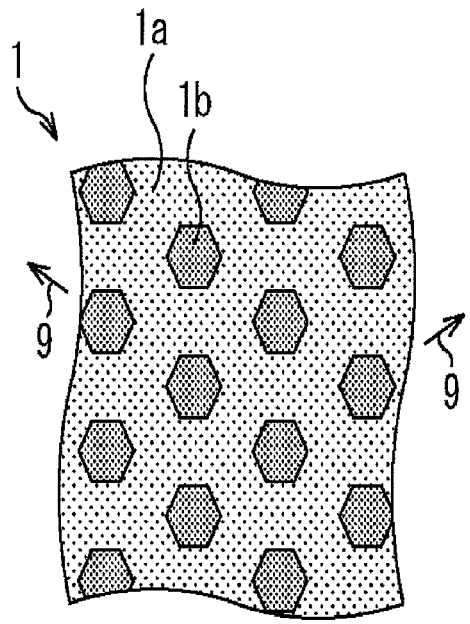
FIGS. 3A, 3B, 3C, 3D are schematic views illustrating examples of planar shapes of large-thermal expansion coefficient regions and small-thermal expansion coefficient regions.
Figure 3B:
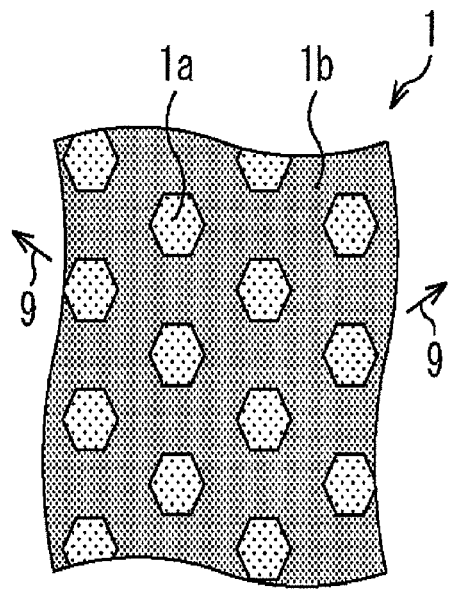
Figure 3C:
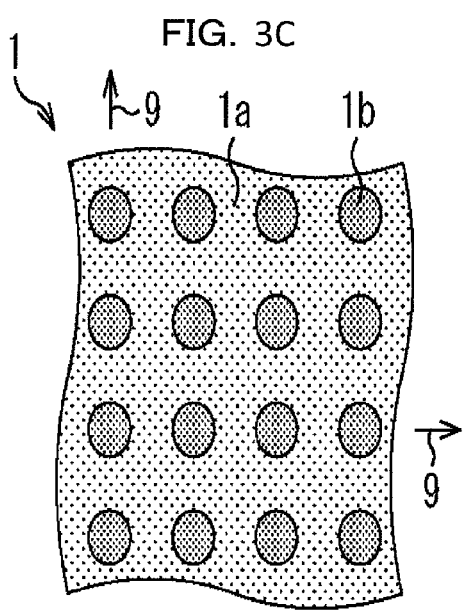
Figure 3D:
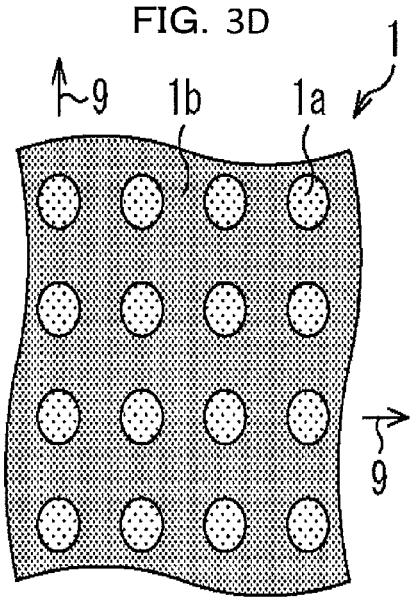

In addition, the planar shapes of the large-thermal expansion coefficient regions 1a and the small-thermal expansion coefficient regions 1b are not limited thereto. For example, as illustrated in FIG. 3A, the small-thermal expansion coefficient regions 1b may be regular-hexagonal in planar shape. Alternatively, as illustrated in FIG. 3B, the large-thermal expansion coefficient regions 1a may be regular-hexagonal in planar shape. Yet alternatively, as illustrated in FIG. 3C, the small-thermal expansion coefficient regions 1b may be circular in planar shape. Still alternatively, as illustrated in FIG. 3D, the large-thermal expansion coefficient regions 1a may be circular in planar shape.

Yet additionally, a ratio between the large-thermal expansion coefficient regions 1a and the small-thermal expansion coefficient regions 1b is not limited thereto. However, the ratio between the large-thermal expansion coefficient regions 1a and the small-thermal expansion coefficient regions 1b is preferably determined as appropriate, according to the respective thermal expansion coefficients and thicknesses and the like of the electron transit layer 2, the large-thermal expansion coefficient regions 1a, and the small-thermal expansion coefficient regions 1b.

The large-thermal expansion coefficient regions 1a and the small-thermal expansion coefficient regions 1b are preferably arranged irregularly, rather than regularly. This is for the purpose of suppressing a variation in average thermal expansion coefficient among directions parallel to a surface of the substrate 1. In addition, the ratio between the large-thermal expansion coefficient regions 1a and the small-thermal expansion coefficient regions 1b is preferably uniform among directions parallel to the surface of the substrate 1. For example, the variation of this ratio from an average value thereof preferably falls within 10% in every direction, more preferably within 5%, and even more preferably within 3%. If the large-thermal expansion coefficient regions 1a and the small-thermal expansion coefficient regions 1b are arranged regularly, the pitch of arrangement is preferably small. Preferably, the pitch in a direction in which the regions are most densely arranged is 1 µm or smaller. A direction 9 in each of FIGS. 2 and 3 corresponds to the direction in which the large-thermal expansion coefficient regions 1a and the small-thermal expansion coefficient regions 1b are most densely arranged in each example.

Second Embodiment

Figure 4A:
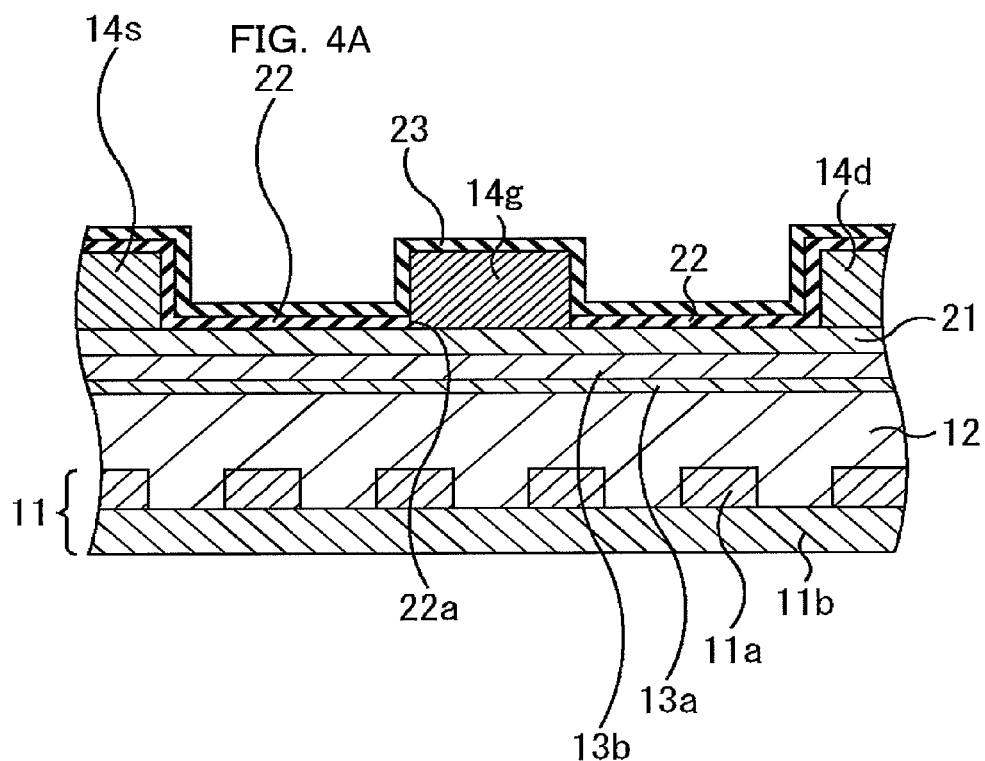
FIGS. 4A, 4B are schematic views illustrating a structure of a GaN-based HEMT according to a second embodiment.
Figure 4B:
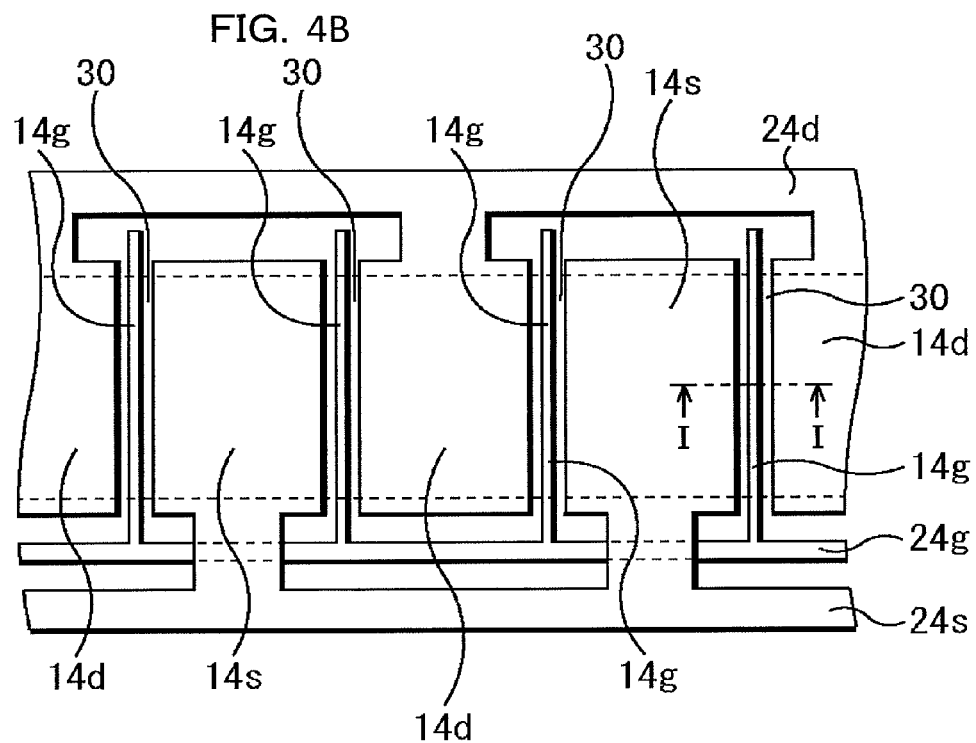

Next, a second embodiment will be described. FIGS. 4A, 4B are schematic views illustrating a structure of a GaN-based HEMT (compound semiconductor device) according to the second embodiment.

In the second embodiment, as illustrated in FIG. 4A, an approximately 1 to 4 µm-thick (for example, 3 µm-thick) undoped i-GaN layer 12 is formed on a substrate 11, an approximately 1 to 30 nm-thick (for example, 5 nm-thick) undoped i-AlGaN layer 13a is formed on the i-GaN layer 12, and an approximately 3 to 30 nm-thick (for example, 30 nm-thick) n-type n-AlGaN layer 13b is formed on the i-AlGaN layer 13a. The Al composition of the i-AlGaN layer 13a and the n-AlGaN layer 13b is approximately 0.1 to 0.5 (for example, 0.2). The n-AlGaN layer 13b is doped with an approximately $1\times10^{18}$ to $1\times10^{20}$ cm$^{-3}$ (for example, $5\times10^{18}$ cm$^{-3}$) of Si. An approximately 2 to 20 nm-thick (for example, 10 nm-thick) n-type n-GaN layer 21 is formed on the n-AlGaN layer 13b. The n-GaN layer 21 is doped with an approximately $1\times10^{18}$ to $1\times10^{20}$ cm$^{-3}$ (for example, $5\times10^{18}$ cm$^{-3}$) of Si.

A source electrode 14s and a drain electrode 14d are formed on the n-GaN layer 21. The source electrode 14s and the drain electrode 14d have ohmic contact with the n-GaN layer 21. The source electrode 14s and the drain electrode 14d include, for example, a Ti film and an Al film formed thereon. A passivation film 22 covering the source electrode 14s and the drain electrode 14d is also formed on the n-GaN layer 21. As the passivation film 22, a silicon nitride film, for example, is formed. An opening 22a for a gate electrode is formed in a portion of the passivation film 22 located between the source electrode 14s and the drain electrode 14d. In addition, a gate electrode 14g having Schottky contact with the n-GaN layer 21 is formed through the opening 22a. The gate electrode 14g includes, for example, an Ni film and an Au film formed thereon. A passivation film 23 covering the gate electrode 14g is formed on the passivation film 22. As the passivation film 23, a silicon nitride film, for example, is formed. Openings for the connection of external terminals and the like are formed in the passivation films 22 and 23.

In the second embodiment, as illustrated in FIG. 4A, the substrate 11 includes a silicon substrate material 11b and a sapphire substrate material 11a which is formed on the silicon substrate material 11b and in which openings are provided. As will be described later, the i-GaN layer 12 functions as an electron transit layer. In addition, the thermal expansion coefficient of silicon contained in the silicon substrate material 11b is smaller than that of GaN, and the thermal expansion coefficient of sapphire contained in the sapphire substrate material 11a is larger than that of GaN. That is, large-thermal expansion coefficient regions containing sapphire having a larger thermal expansion coefficient than GaN and a small-thermal expansion coefficient region containing silicon having a smaller thermal expansion coefficient than GaN are mixedly present on a surface of the substrate 11.

Note that a layout as viewed from the front surface side of the substrate 11 corresponds, for example, to FIG. 4B. That is, gate electrodes 14g, source electrodes 14s and drain electrodes 14d are arranged like comb teeth in planar shape, and the source electrodes 14s and the drain electrodes 14d are alternately disposed. In other words, a plurality of gate electrodes 14g is common-connected by a gate interconnect 24g, a plurality of source electrodes 14s is common-connected by a source interconnect 24s, and a plurality of drain electrodes 14d is common-connected by a drain interconnect 24d. The gate electrodes 14g are disposed among these source and drain electrodes. Output power may be enhanced by adopting such a multi-fingered gate structure as described above. Note that the cross-sectional view illustrated in FIG. 4A depicts a cross section viewed along a line I-I in FIG. 4B. In addition, an active region 30 includes the i-GaN layer 12, the i-AlGaN layer 13a, the n-AlGaN layer 13b, and the like. The periphery of each active region 30 is defined as an inactive region by ion implantation, mesa etching or the like.

In the second embodiment configured as described above, high-concentration carriers resulting from piezoelectric polarization are generated at a heterojunction interface between the i-GaN layer 12 and the i-AlGaN layer 13a. That is, electrons are induced near an interface of the i-GaN layer 12 with the i-AlGaN layer 13a by a piezoelectric effect due to lattice mismatch. As a result, a two-dimensional electron gas layer (2DEG) arises, and this layer functions as an electron transit layer (channel). In addition, the i-AlGaN layer 13a and the n-AlGaN layer 13b function as electron supply layers.

In addition, in the second embodiment, the large-thermal expansion coefficient regions containing sapphire having a larger thermal expansion coefficient than GaN and the small-thermal expansion coefficient region containing silicon having a smaller thermal expansion coefficient than GaN are mixedly present on the surface of the substrate 11, as described above. Accordingly, even if the i-GaN layer 12 functioning as an electron transit layer is formed by high-temperature epitaxy, it is possible to prevent the substrate 11 from warpage, cracks and the like at that time, similarly to the first embodiment.

Figure 5A:
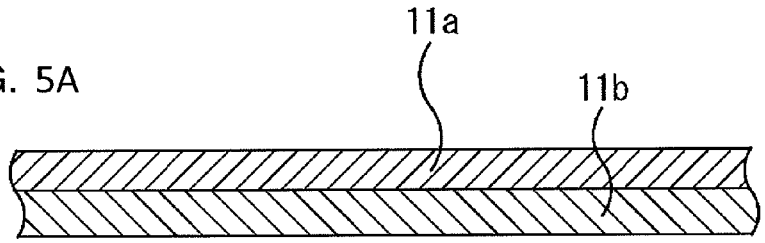
FIGS. 5A, 5B, 5C, 5D, 5E are cross-sectional views illustrating a method for manufacturing the GaN-based HEMT according to the second embodiment in the order of steps.
Figure 5B:
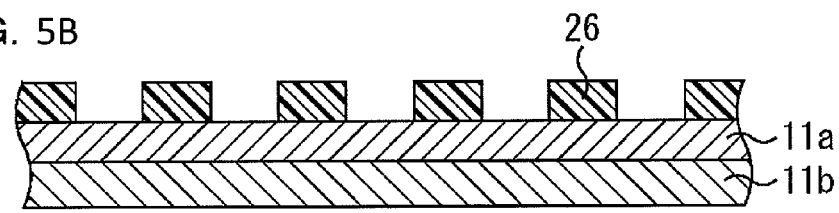

Next, a description will be given of a method for manufacturing a GaN-based HEMT (compound semiconductor device) according to the second embodiment. FIGS. 5A and 5B are cross-sectional views illustrating the method for manufacturing the GaN-based HEMT (compound semiconductor device) according to the second embodiment in the order of steps.

Figure 5C:
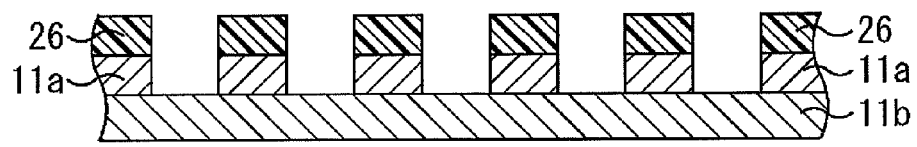
Figure 5D:
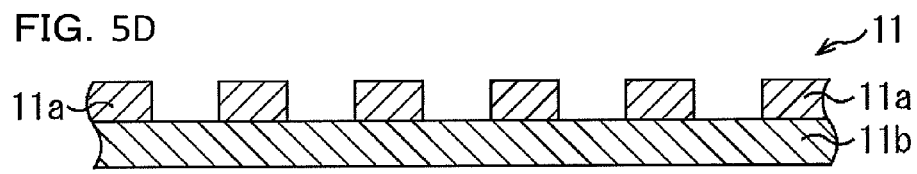

First, as illustrated in FIG. 5A, a sapphire substrate material 11a is bonded onto a silicon substrate material 11b. In this bonding, thermal adhesion, for example, is performed. Note that a natural oxide film may be present on a surface of the silicon substrate material 11b. Then, as illustrated in FIG. 5B, a resist pattern 26 exposing regions in which openings are to be formed is formed on the sapphire substrate material 11a. Thereafter, as illustrated in FIG. 5C, etching, for example, wet etching is performed using the resist pattern 26 as a mask to form, in the sapphire substrate material 11a, openings exposing parts of the silicon substrate material 11b. If a natural oxide film is present on the surface of the silicon substrate material 11b, portions of the natural oxide film exposed in the openings of the sapphire substrate material 11a are removed at the time of this opening formation. Then, as illustrated in FIG. 5D, the resist pattern 26 is removed. A substrate 11 may thus be obtained.

Figure 5E:
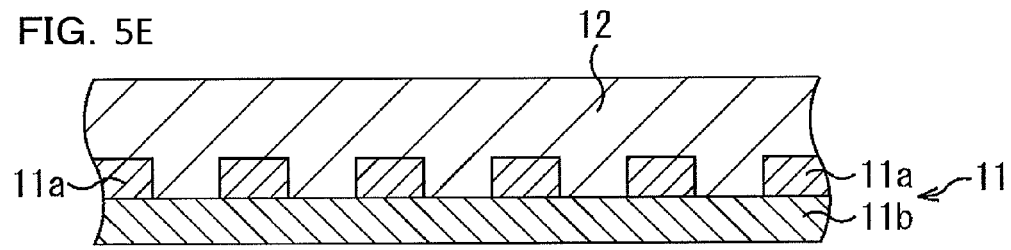
Figure 5F:
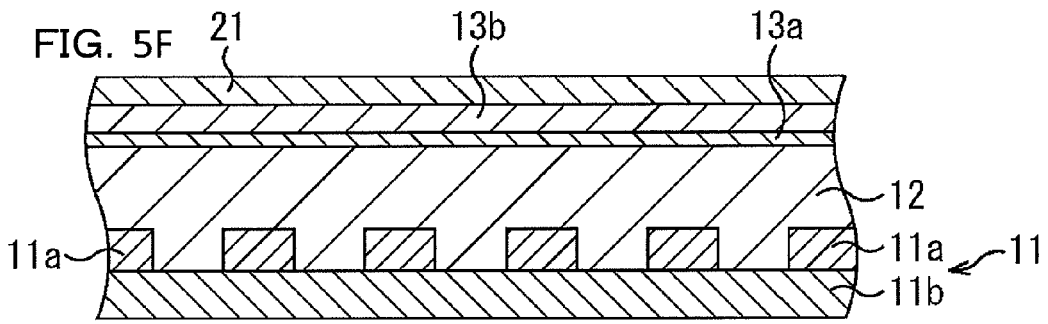
FIGS. 5F, 5G, 5H are cross-sectional views illustrating the method for manufacturing the GaN-based HEMT in the order of steps following the steps of FIGS. 5A, 5B, 5C, 5D, 5E.

Subsequently, as illustrated in FIG. 5E, an i-GaN layer 12 is formed on the substrate 11 and, as illustrated in FIG. 5F, an i-AlGaN layer 13a, an n-AlGaN layer 13b and an n-GaN layer 21 are formed on the i-GaN layer 12. The i-GaN layer 12, the i-AlGaN layer 13a, the n-AlGaN layer 13b and the n-GaN layer 21 are formed by a crystal growth method, such as a metal organic vapor phase epitaxy (MOVPE) method. In this case, these layers may be continuously formed by selecting raw material gases. As raw materials of aluminum (Al) and gallium (Ga), trimethyl aluminum (TMA) and trimethyl gallium (TMG), for example, may be used respectively. As a raw material of nitrogen (N), ammonia ($NH_3$), for example, may be used. As a raw material of silicon (Si) contained as an impurity in the n-AlGaN layer 13b and the n-GaN layer 21, silane ($SiH_4$), for example, may be used. The i-GaN layer 12, the i-AlGaN layer 13a, the n-AlGaN layer 13b and the n-GaN layer 21 contain a nitride semiconductor. In the present embodiment, large-thermal expansion coefficient regions containing sapphire having a larger thermal expansion coefficient than GaN and a small-thermal expansion coefficient region containing silicon having a smaller thermal expansion coefficient than GaN are mixedly present on a surface of the substrate 11. Consequently, it is possible to prevent the substrate 11 from warpage, cracks and the like at the time of forming these nitride semiconductor layers.

Figure 5G:
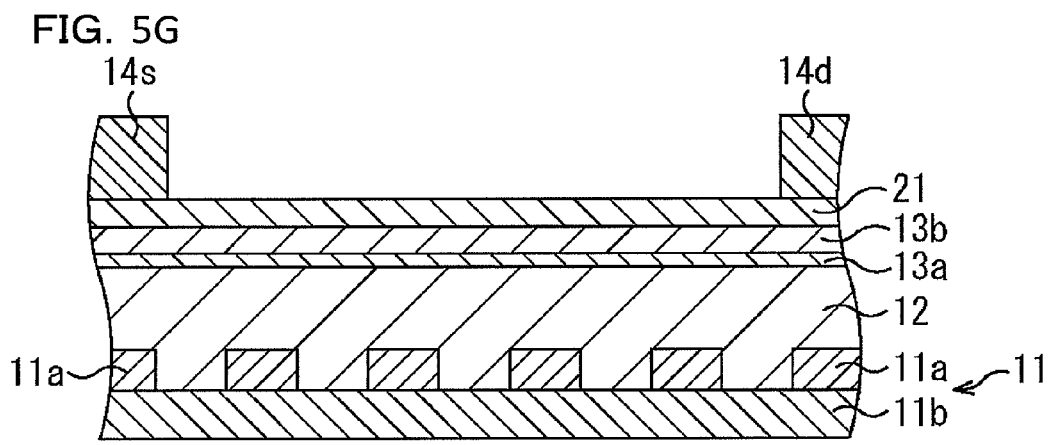

After the formation of the n-GaN layer 21, a source electrode 14s and a drain electrode 14d are formed on the n-GaN layer 21 by, for example, a liftoff method, as illustrated in FIG. 5G. In the formation of the source electrode 14s and the drain electrode 14d, there is formed a resist pattern for creating openings in regions in which the source electrode 14s and the drain electrode 14d are to be formed. In addition, Ti and Al are vapor-deposited, and then Ti and Al attached onto the resist pattern are removed together with the resist pattern. Then, heat treatment is performed at 400 to 1000° C. (for example, 600° C.) in a nitrogen atmosphere to establish ohmic contact.

Figure 5H:
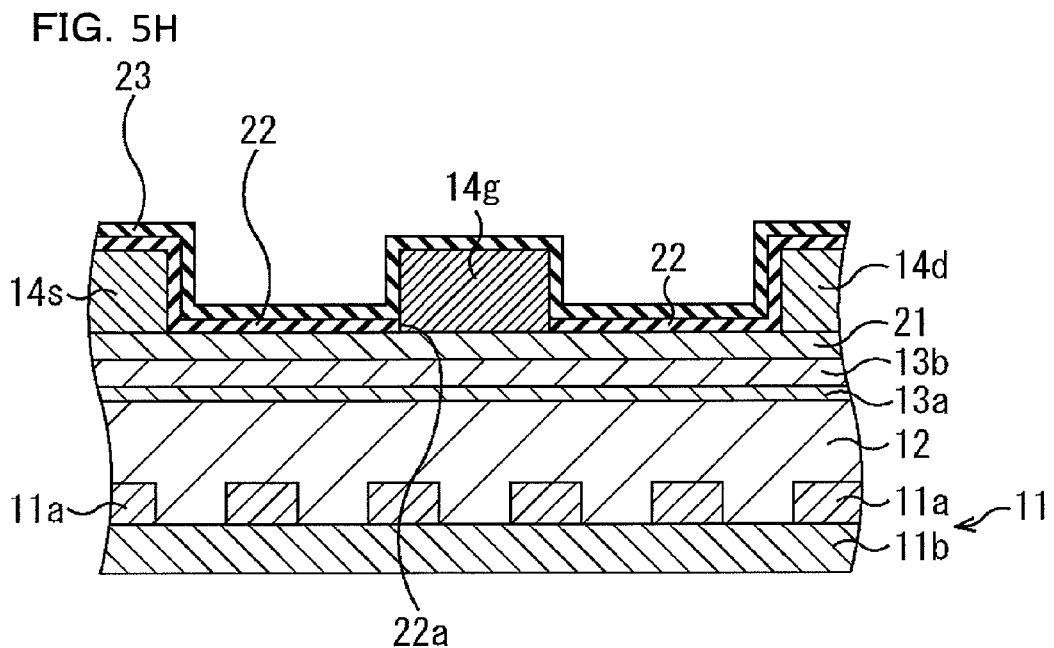

Next, as illustrated in FIG. 5H, a passivation film 22 is formed on the n-GaN layer 21, so as to cover the source electrode 14s and the drain electrode 14d. As the passivation film 22, a silicon nitride film is formed by, for example, a plasma CVD (chemical vapor deposition) method. Thereafter, there is formed a resist pattern exposing a region in which an opening 22a is to be formed. Subsequently, etching using the resist pattern is performed to form the opening 22a in the passivation film 22. Then, a gate electrode 14g adapted to have contact with the n-GaN layer 21 through the opening 22a is formed by a liftoff method. In the formation of the gate electrode 14g, there is formed a new resist pattern for creating an opening in a region in which the gate electrode 14g is formed, after the resist pattern used when forming the opening 22a is removed. In addition, Ni and Au are vapor-deposited, and then Ni and Au attached onto the resist pattern are removed together with the resist pattern. Thereafter, a passivation film 23 is formed on the passivation film 22, so as to cover the gate electrode 14g. As the passivation film 23, a silicon nitride film is formed by, for example, a plasma CVD method.

Subsequently, there are formed a gate interconnect 24g for common-connecting a plurality of gate electrodes 14g, a source interconnect 24s for common-connecting a plurality of source electrodes 14s, a drain interconnect 24d for common-connecting a plurality of drain electrodes 14d, and the like (see FIG. 4B). A GaN-based HEMT having a structure illustrated in FIGS. 4A, 4B may thus be obtained.

Note that as illustrated in FIG. 6, openings for the source electrode 14s and the drain electrode 14d may be provided in the n-GaN layer 21, and the source electrode 14s and the drain electrode 14d may be formed so as to have contact with the n-AlGaN layer 13b. In this case, the depth of the openings may be such that part of the n-GaN layer 21 remains therein or part of the n-AlGaN layer 13b is removed therefrom. That is, the bottom face of the openings need not necessarily be flush with the undersurface of the n-GaN layer 21.

Third Embodiment

Next, a third embodiment will be described. FIG. 7 is a schematic view illustrating a structure of a GaN-based HEMT (compound semiconductor device) according to the third embodiment.

In the third embodiment, as illustrated in FIG. 7, a buffer layer 31 for covering exposed portions of a silicon substrate material 11b is formed inside openings of a sapphire substrate material 11a. As the buffer layer 31, an approximately 10 to 300 nm-thick (for example, 100 nm-thick) AlN layer or AlGaN layer, for example, is used. The rest of configuration is the same as that of the second embodiment.

According to the third embodiment configured as described above, strain and the like between the silicon substrate material lib and the i-GaN layer 12 are relieved by the buffer layer 31. This makes the crystallinity of the i-GaN layer 12 even more excellent.

Next, a description will be given of a method for manufacturing the GaN-based HEMT (compound semiconductor device) according to the third embodiment. FIGS. 8A-8D are cross-sectional views illustrating the method for manufacturing the GaN-based HEMT (compound semiconductor device) according to the third embodiment in the order of steps.

Figure 8A:
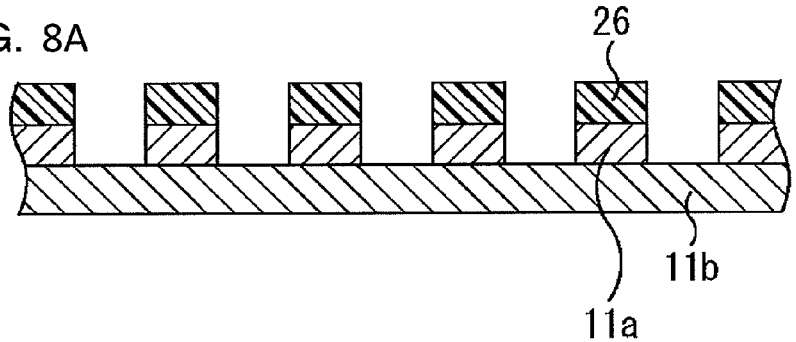
FIGS. 8A, 8B, 8C, 8D are cross-sectional views illustrating a method for manufacturing the GaN-based HEMT according to the third embodiment in the order of steps.
Figure 8B:
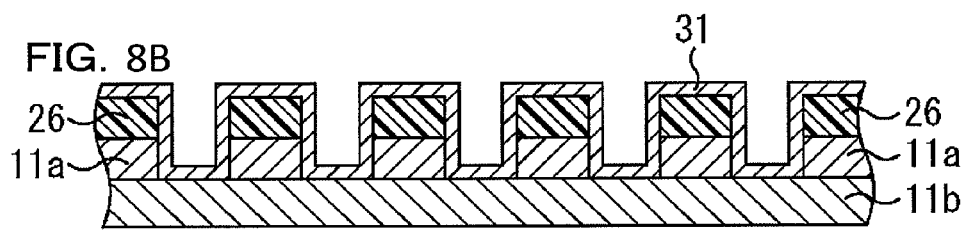
Figure 8C:
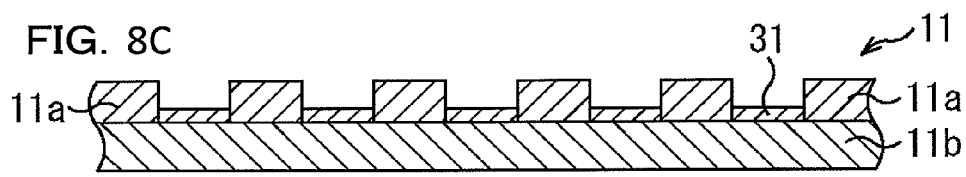

First, as illustrated in FIG. 8A, process steps up to forming openings in a sapphire substrate material 11a are carried out in the same way as in the second embodiment. Then, as illustrated in FIG. 8B, a buffer layer 31 is formed on the entire surface of the HEMT being fabricated. The buffer layer 31 is formed by a crystal growth method, such as an MOVPE method. Thereafter, as illustrated in FIG. 8C, remnants of the buffer layer 31 and the resist pattern 26 are removed, while leaving parts of the buffer layer 31 inside the openings of the sapphire substrate material 11a. A substrate 11 may thus be obtained.

Figure 8D:
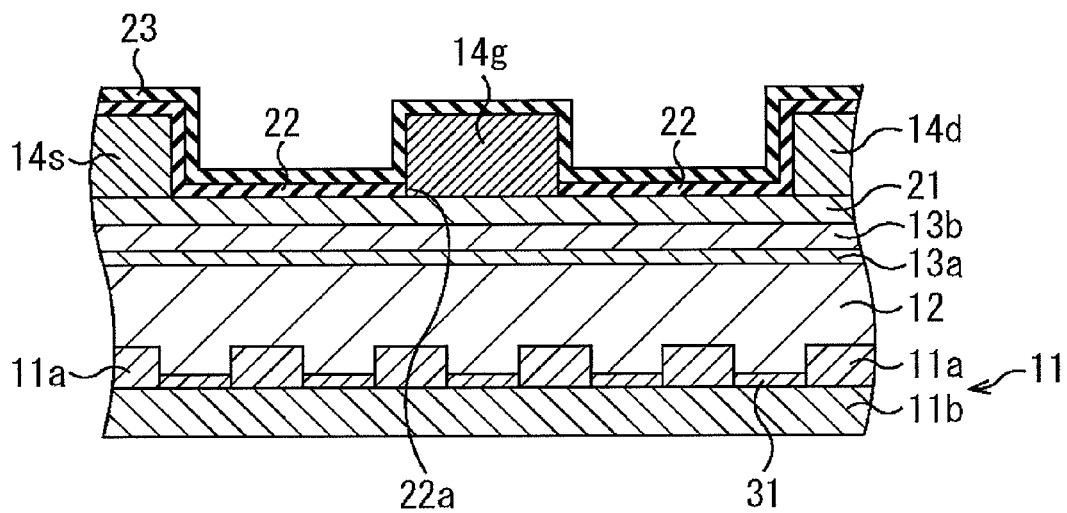

Thereafter, as illustrated in FIG. 8D, process steps from forming an i-GaN layer 12 up to forming a passivation film 23 are carried out in the same way as in the second embodiment. Subsequently, there are formed a gate interconnect 24g for common-connecting a plurality of gate electrodes 14g, a source interconnect 24s for common-connecting a plurality of source electrodes 14s, a drain interconnect 24d for common-connecting a plurality of drain electrodes 14d, and the like. A GaN-based HEMT having a structure illustrated in FIG. 7 may thus be obtained.

Fourth Embodiment

Figure 9A:
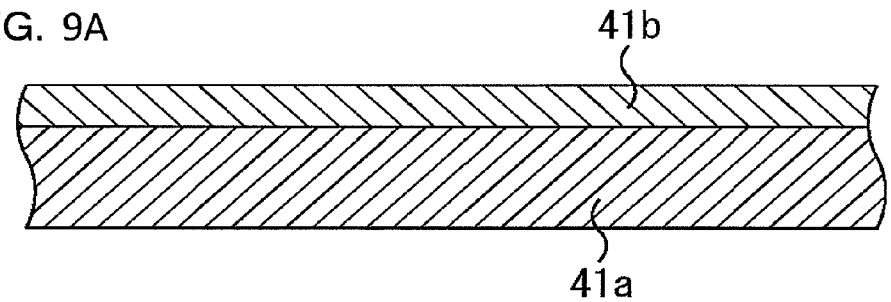
FIGS. 9A, 9B, 9C, 9D are cross-sectional views illustrating a method for manufacturing a GaN-based HEMT according to a fourth embodiment in the order of steps.
Figure 9B:
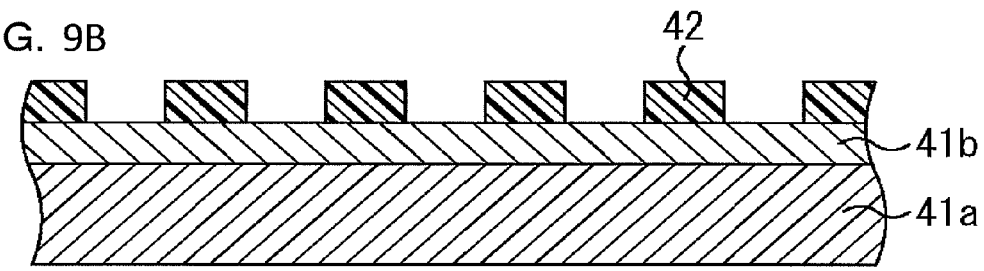

Next, a fourth embodiment will be described. Here, a structure of a GaN-based HEMT (compound semiconductor device) will be described along with a method for manufacturing the GaN-based HEMT. FIGS. 9A and 9B are cross-sectional views illustrating the method for manufacturing the GaN-based HEMT (compound semiconductor device) according to the fourth embodiment in the order of steps.

Figure 9C:
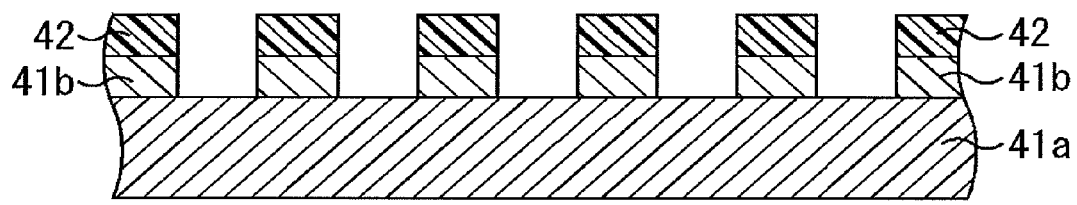
Figure 9D:
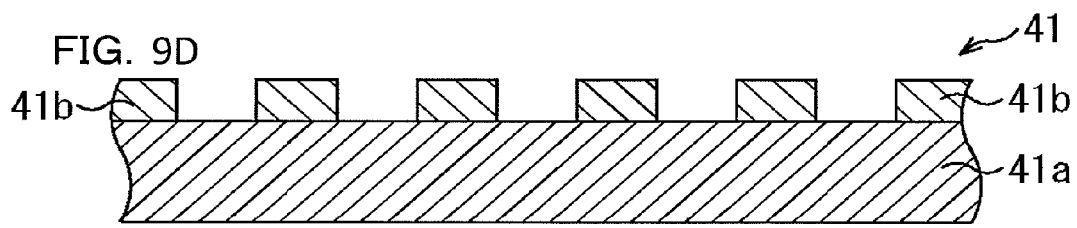

First, as illustrated in FIG. 9A, there is prepared a substrate in which a silicon substrate material 41b is provided on a sapphire substrate material 41a. As the substrate, a substrate distributed as a silicon-on-sapphire (SOS) substrate may be used. Alternatively, the substrate may be formed by means of thermal adhesion or the like. Next, as illustrated in FIG. 9B, there is formed, on the silicon substrate material 41b, a resist pattern 42 exposing regions in which openings are to be formed. Thereafter, as illustrated in FIG. 9C, etching, for example, wet etching is performed using the resist pattern 42 as a mask to form, in the silicon substrate material 41b, openings exposing parts of the sapphire substrate material 41a. Then, as illustrated in FIG. 9D, the resist pattern 42 is removed. A substrate 41 may thus be obtained.

Figure 9E:
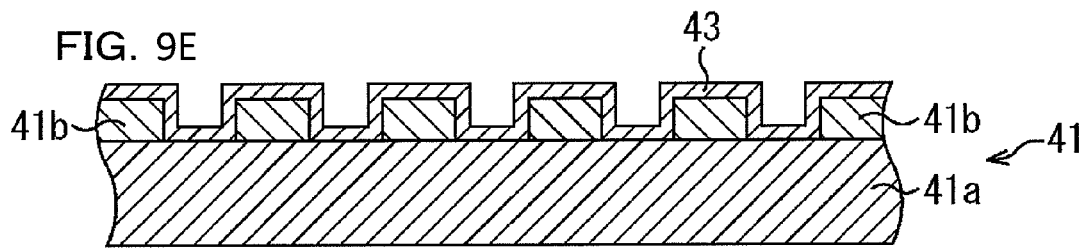
FIGS. 9E, 9F, 9G are cross-sectional views illustrating the method for manufacturing the GaN-based HEMT in the order of steps following the steps of FIGS. 9A, 9B, 9C, 9D.
Figure 9F:
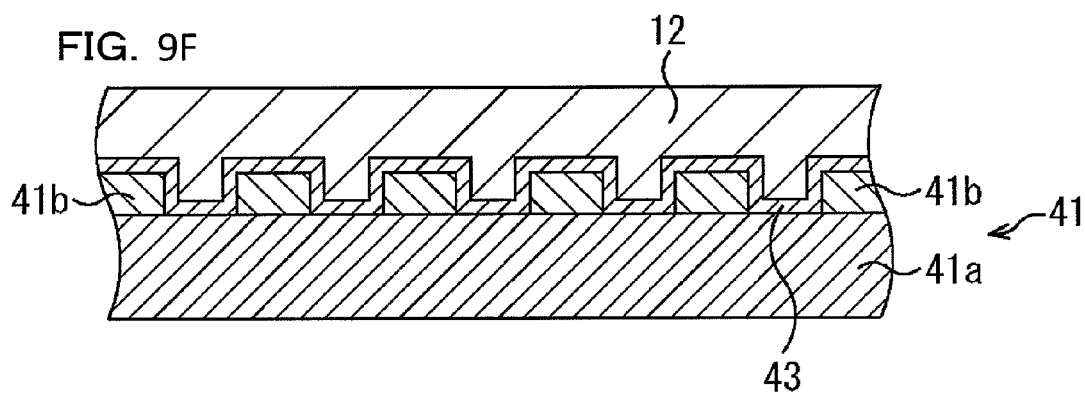
Figure 9G:
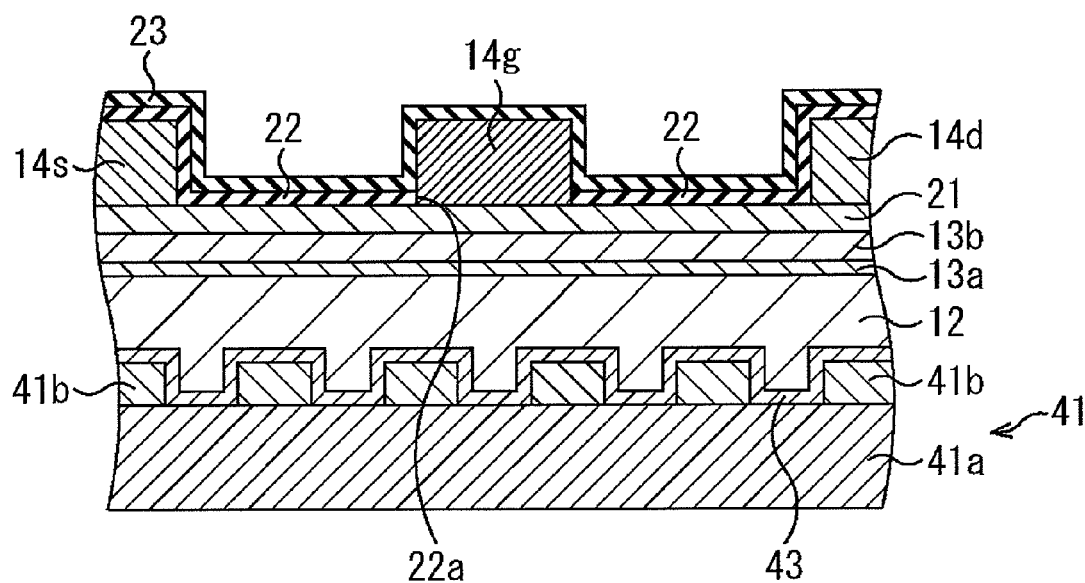

Next, as illustrated in FIG. 9E, a buffer layer 43 is formed on the entire surface of the HEMT being fabricated. As the buffer layer 43, an approximately 10 to 300 nm-thick (for example, 100 nm-thick) AlN layer or AlGaN layer, for example, is formed. Thereafter, as illustrated in FIG. 9F, an i-GaN layer 12 is formed on the buffer layer 43 in the same way as in the second embodiment. In addition, as illustrated in FIG. 9G, an i-AlGaN layer 13a, an n-AlGaN layer 13b and an n-GaN layer 21 are formed on the i-GaN layer 12. The buffer layer 43 is formed by a crystal growth method, such as an MOVPE method. The i-GaN layer 12, the i-AlGaN layer 13a, the n-AlGaN layer 13b and the n-GaN layer 21 may be formed continuously along with the buffer layer 43. In the present embodiment, a large-thermal expansion coefficient region containing sapphire having a larger thermal expansion coefficient than GaN and small-thermal expansion coefficient regions containing silicon having a smaller thermal expansion coefficient than GaN are mixedly present on a surface of the substrate 41. Consequently, it is possible to prevent the substrate 41 from warpage, cracks and the like at the time of forming these nitride semiconductor layers.

Thereafter, also as illustrated in FIG. 9G, process steps from forming a source electrode 14s and a drain electrode 14d up to forming a passivation film 23 are carried out in the same way as in the second embodiment. Subsequently, there are formed a gate interconnect 24g for common-connecting a plurality of gate electrodes 14g, a source interconnect 24s for common-connecting a plurality of source electrodes 14s, a drain interconnect 24d for common-connecting a plurality of drain electrodes 14d, and the like. The GaN-based HEMT may thus be obtained.

Figure 10:
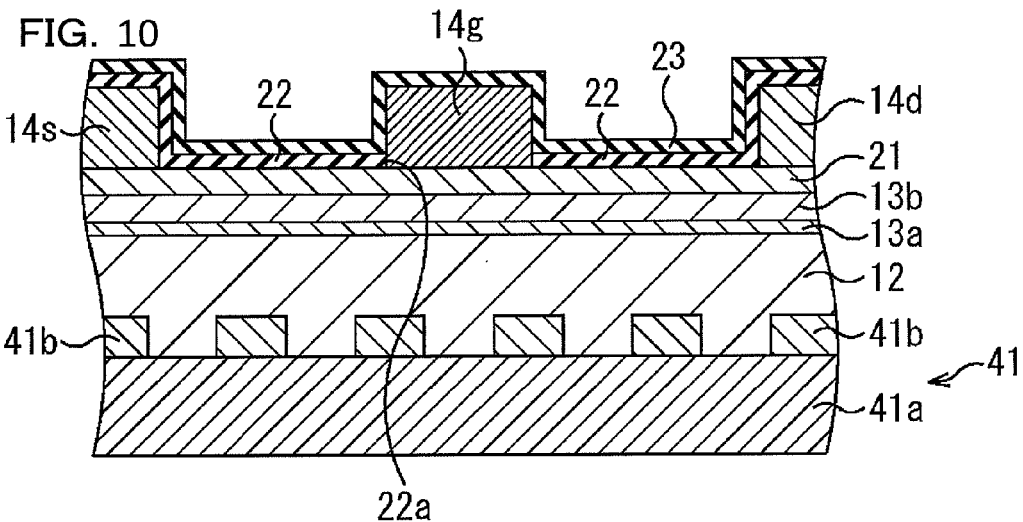
FIG. 10 is a cross-sectional view illustrating a modified example of the fourth embodiment.

Note that as illustrated in FIG. 10, the formation of the buffer layer 43 may be omitted.

Fifth Embodiment

Figure 11A:
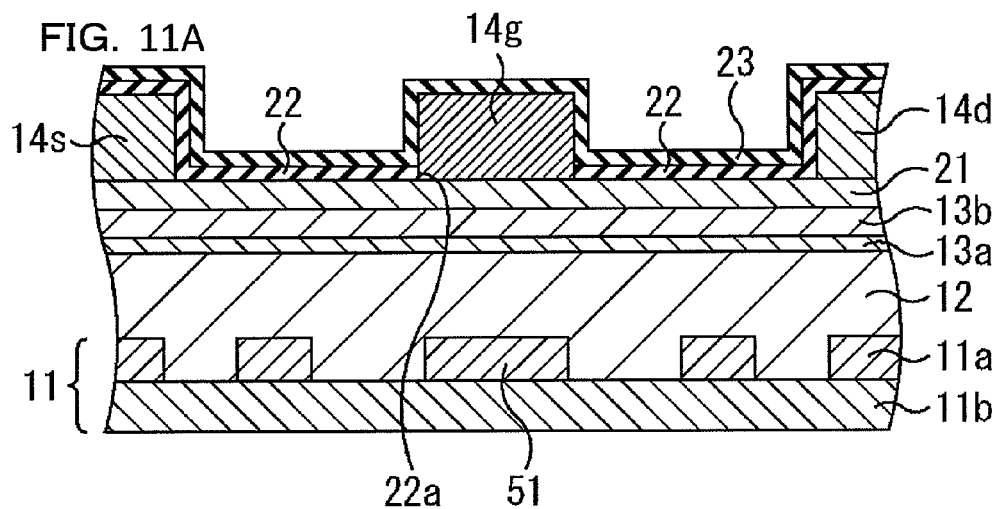
FIGS. 11A, 11B are schematic views illustrating a structure of a GaN-based HEMT according to a fifth embodiment.
Figure 11B:
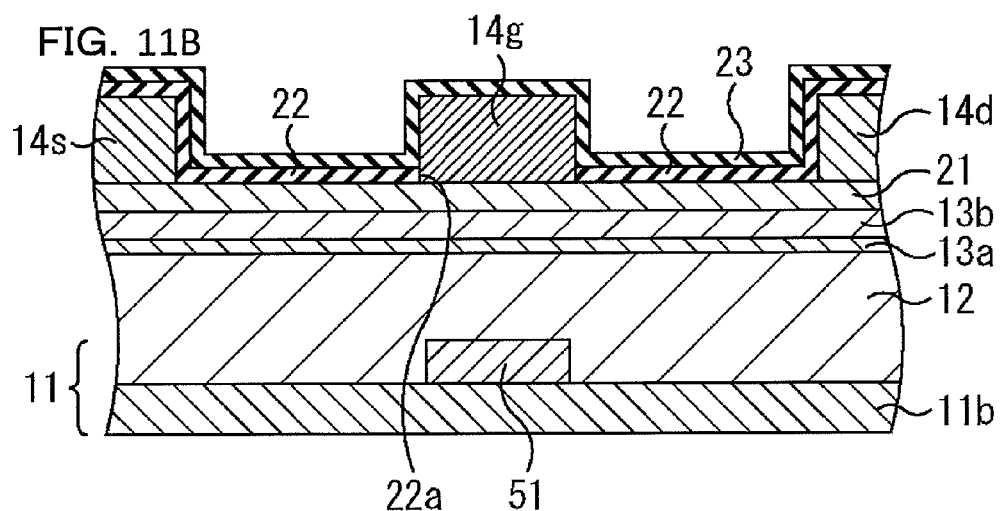

Next, a fifth embodiment will be described. FIGS. 11A-11B are schematic views illustrating a structure of a GaN-based HEMT (compound semiconductor device) according to the fifth embodiment.

In the fifth embodiment, as illustrated in FIGS. 11A and 11B, the HEMT is configured in the manner that in the second embodiment, the sapphire substrate material 11a includes a channel stress adjustment part 51 provided so as to overlap with the gate electrode 14g in plan view. The rest of configuration is the same as that of the second embodiment.

According to the fifth embodiment configured as described above, a two-dimensional electron gas layer is prevented from arising immediately below the gate electrode 14g, thereby enabling normally-off operation. In addition, as illustrated in FIG. 11B, it is possible to secure an adequate two-dimensional electron gas layer between the gate electrode 14g and the source electrode 14s and between the gate electrode 14g and the drain electrode 14d, while preventing the two-dimensional electron gas layer from arising immediately below the gate electrode 14g, if the sapphire substrate material 11a includes the channel stress adjustment part 51 alone.

Such a configuration of the fifth embodiment as described above may be applied to the first, third and fourth embodiments.

Likewise, the configuration of the modified example of the second embodiment illustrated in FIG. 6 may be applied to the first, third, fourth and fifth embodiments.

In addition, resistors, capacitors and the like may also be built onto the substrate 11 or 41 to form a monolithic microwave integrated circuit (MMIC).

Figure 12:
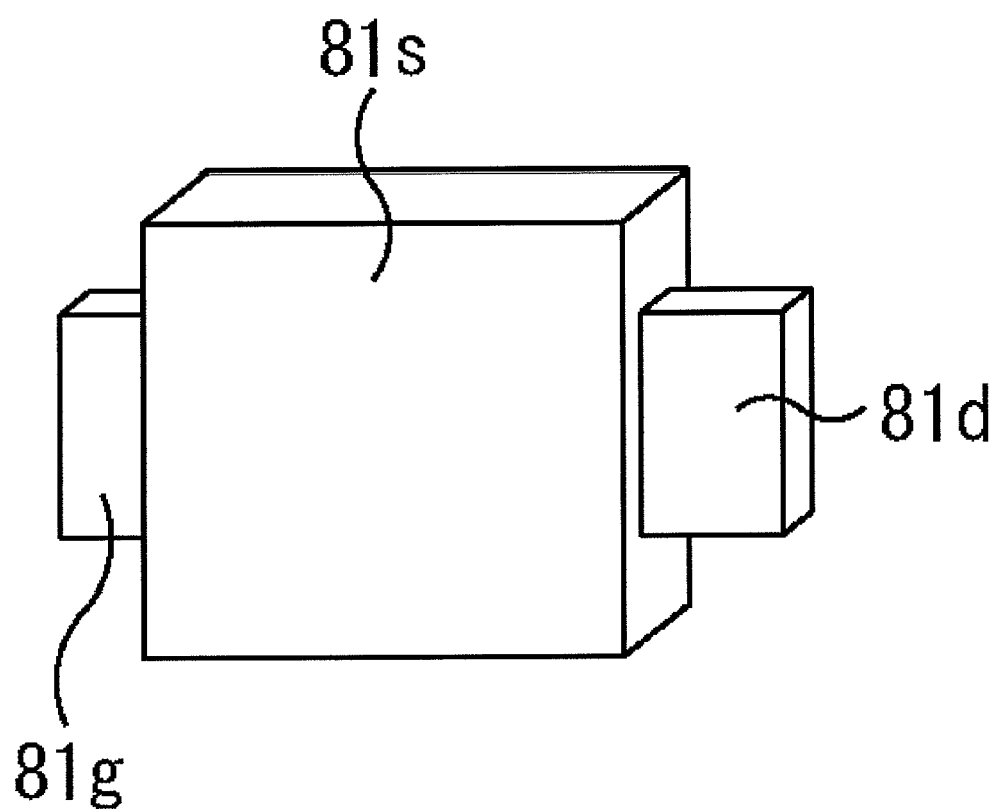
FIG. 12 is a schematic view illustrating an example of an external view of a high-power amplifier.

GaN-based HEMTs according to these embodiments may be used as, for example, high-power amplifiers. FIG. 12 illustrates an external view of a high-power amplifier. In this example, a source terminal 81s connected to the source electrode is provided on a surface of a package. In addition, a gate terminal 81g connected to the gate electrode and a drain terminal 81d connected to the drain electrode extend out of side surfaces of the package.

Figure 13A:
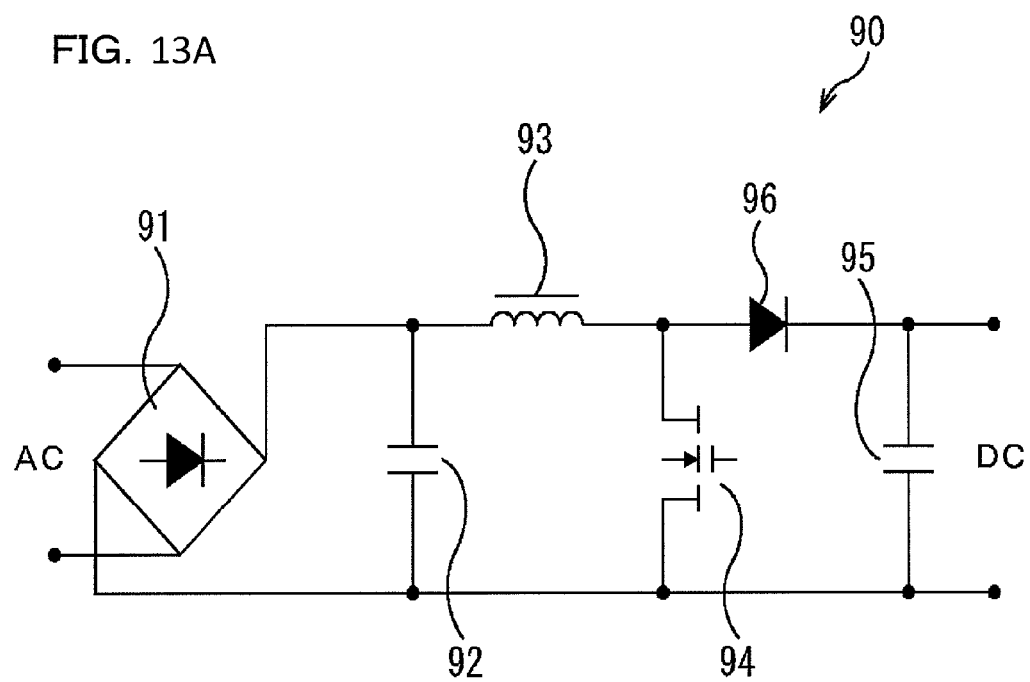
FIGS. 13A, 13B are schematic views illustrating a power supply device.

GaN-based HEMTs according to these embodiments may also be used in, for example, power supply devices. FIG. 13A is a circuit diagram illustrating a PFC (power factor correction) circuit, whereas FIG. 13B is a schematic view illustrating a server power supply (power supply device) including the PFC circuit illustrated in FIG. 13A.

As illustrated in FIG. 13A, a PFC circuit 90 is provided with a capacitor 92 connected to a diode bridge 91 to which an AC power source (AC) is connected. One terminal of a choke coil 93 is connected to one terminal of the capacitor 92, and one terminal of a switch element 94 and the anode of a diode 96 are connected to the other terminal of the choke coil 93. The switch element 94 corresponds to a HEMT of any one of the above-described embodiments, and the one terminal of the switch element 94 corresponds to a drain electrode of the HEMT. In addition, the other terminal of the switch element 94 corresponds to a source electrode of the HEMT. One terminal of a capacitor 95 is connected to the cathode of the diode 96. The other terminal of the capacitor 92, the other terminal of the switch element 94, and the other terminal of the capacitor 95 are grounded. A DC power source (DC) is derived from between both terminals of the capacitor 95.

Figure 13B:
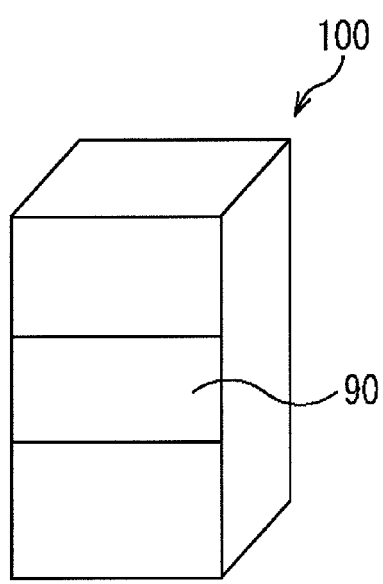

As illustrated in FIG. 13B, the PFC circuit 90 is used after being assembled into a server power supply 100 or the like.

It is also possible to configure a power supply device capable of higher-speed operation, equivalent or similar to such a server power supply 100 as mentioned above. In addition, a switch element equivalent or similar to the switch element 94 may be used in a switching power supply or an electronic apparatus. Yet additionally, these semiconductor devices may be used as a component for a full-bridge power supply circuit, such as a power supply circuit of a server.

In either embodiment, a silicon carbide (SiC) substrate, a sapphire substrate, a silicon substrate, a GaN substrate, a GaAs substrate, or the like may be used as the substrate. The substrate may be electroconductive, semi-insulative, or insulative.

In addition, the structures of a gate electrode, a source electrode and a drain electrode are not limited to those mentioned in the above-described embodiments. For example, each of these electrodes may be composed of a single layer. Yet additionally, a method for forming these electrodes is not limited to a liftoff method. Still additionally, heat treatment after the formation of source and drain electrodes may be skipped, as long as ohmic characteristics are available. Heat treatment may be performed on the gate electrode.

The thickness, material and the like of each layer are not limited to those mentioned in the above-described embodiments.

Hereinafter, aspects of the present invention will be collectively described as supplementary notes.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device comprising:
   a substrate;
   an electron transit layer formed on and above the substrate; and
   an electron supply layer formed on and above the electron transit layer,
   wherein a first region or regions having a smaller thermal expansion coefficient than the electron transit layer and a second region or regions having a larger thermal expansion coefficient than the electron transit layer are mixedly present on a surface of the substrate.

2. The compound semiconductor device according to claim 1, the substrate including:
   a first substrate material having a smaller thermal expansion coefficient than the electron transit layer; and
   a second substrate material provided on the first substrate material and having a larger thermal expansion coefficient than the electron transit layer,
   wherein openings are formed to expose the first substrate material in the second substrate material.

3. The compound semiconductor device according to claim 1, the substrate including:
   a second substrate material having a larger thermal expansion coefficient than the electron transit layer; and
   a first substrate material provided on the second substrate material and having a smaller thermal expansion coefficient than the electron transit layer,
   wherein openings are formed to expose the second substrate material in the first substrate material.

4. The compound semiconductor device according to claim 1, wherein the first substrate material is a silicon substrate material.

5. The compound semiconductor device according to claim 1, wherein the second substrate material is a sapphire substrate material.

6. The compound semiconductor device according to claim 1, wherein the electron transit layer contains a nitride semiconductor.

7. The compound semiconductor device according to claim 1, wherein the first regions and the second regions are irregularly arranged.

8. A power supply device comprising a compound semiconductor device, wherein the compound semiconductor device comprises:
   a substrate;
   an electron transit layer formed on and above the substrate; and
   an electron supply layer formed on and above the electron transit layer, wherein a first region or regions having a smaller thermal expansion coefficient than the electron transit layer and a second region or regions having a larger thermal expansion coefficient than the electron transit layer are mixedly present on a surface of the substrate.

9. A high-power amplifier comprising a compound semiconductor device, wherein the compound semiconductor device comprises:
   a substrate;
   an electron transit layer formed on and above the substrate; and
   an electron supply layer formed on and above the electron transit layer, wherein a first region or regions having a smaller thermal expansion coefficient than the electron transit layer and a second region or regions having a larger thermal expansion coefficient than the electron transit layer are mixedly present on a surface of the substrate.

10. A method of manufacturing a compound semiconductor device, the method comprising:
    forming an electron transit layer on and above a substrate; and
    forming an electron supply layer on and above the electron transit layer,
    wherein a first region or regions having a smaller thermal expansion coefficient than the electron transit layer and a second region or regions having a larger thermal expansion coefficient than the electron transit layer are mixedly present on a surface of the substrate.

11. The method of manufacturing a compound semiconductor device, according to claim 10, the substrate including:
    a first substrate material having a smaller thermal expansion coefficient than the electron transit layer; and
    a second substrate material provided on the first substrate material and having a larger thermal expansion coefficient than the electron transit layer,
    wherein openings are formed to expose the first substrate material in the second substrate material.

12. The method of manufacturing a compound semiconductor device, according to claim 10, the substrate including:
    a second substrate material having a larger thermal expansion coefficient than the electron transit layer; and
    a first substrate material provided on the second substrate material and having a smaller thermal expansion coefficient than the electron transit layer,
    wherein openings are formed to expose the second substrate material in the first substrate material.

13. The method of manufacturing a compound semiconductor device, according to claim 10, wherein the first substrate material is a silicon substrate material.

14. The method of manufacturing a compound semiconductor device, according to claim 10, wherein the second substrate material is a sapphire substrate material.

15. The method of manufacturing a compound semiconductor device, according to claim 10, wherein the electron transit layer contains a nitride semiconductor.

16. The method of manufacturing a compound semiconductor device, according to claim 10, wherein the first regions and the second regions are irregularly arranged.

* * * * *